(12) United States Patent
Augusteijn et al.

(10) Patent No.: US 8,433,553 B2
(45) Date of Patent: Apr. 30, 2013

(54) METHOD AND APPARATUS FOR DESIGNING A PROCESSOR

(75) Inventors: Alexander Augusteijn, Eindhoven (NL); Jeroen Anton Johan Leijten, Hulsel (NL)

(73) Assignee: Intel Benelux B.V., Ag (NL)

( * ) Notice: Subject to any disclaimer, the term of this patent is extended or adjusted under 35 U.S.C. 154(b) by 527 days.

(21) Appl. No.: 12/264,085

(22) Filed: Nov. 3, 2008

(65) Prior Publication Data
US 2009/0281784 A1 Nov. 12, 2009

Related U.S. Application Data

(60) Provisional application No. 60/984,593, filed on Nov. 1, 2007.

(51) Int. Cl.
*G06F 13/20* (2006.01)

(52) U.S. Cl.
USPC .................. 703/20; 712/24; 716/106

(58) Field of Classification Search .......... 703/21, 703/23, 24, 25, 2, 14, 13, 20; 716/101, 102, 716/104, 106, 1, 18, 108; 711/207; 712/24, 712/241; 717/136, 140; 713/324
See application file for complete search history.

(56) References Cited

U.S. PATENT DOCUMENTS

| | | | |
|---|---|---|---|
| 6,385,757 B1 * | 5/2002 | Gupta et al. | 716/102 |
| 6,408,428 B1 * | 6/2002 | Schlansker et al. | 716/104 |
| 6,453,407 B1 * | 9/2002 | Lavi et al. | 712/24 |
| 6,477,683 B1 * | 11/2002 | Killian et al. | 716/106 |
| 6,629,312 B1 * | 9/2003 | Gupta | 717/136 |
| 6,772,106 B1 * | 8/2004 | Mahlke et al. | 703/21 |
| 6,963,823 B1 * | 11/2005 | Abraham et al. | 703/2 |
| 7,395,419 B1 * | 7/2008 | Gonion | 712/241 |
| 7,788,078 B1 * | 8/2010 | Braun et al. | 703/14 |
| 7,840,776 B1 * | 11/2010 | Kelly et al. | 711/207 |
| 7,886,255 B2 * | 2/2011 | Simar et al. | 716/104 |
| 2002/0059054 A1 * | 5/2002 | Bade et al. | 703/20 |

(Continued)

FOREIGN PATENT DOCUMENTS

| | | |
|---|---|---|
| JP | 2003256487 A | 9/2003 |
| JP | 2003288203 A | 10/2003 |
| JP | 2005269025 A | 9/2005 |
| JP | 2006259805 A | 9/2006 |

OTHER PUBLICATIONS

Design of a VLIW compute Accelerator on the TM-2 by Lei Zhang. 1999 p. 9, paragraph 2.2.2 and figure 2.5 Publisher: Department of Electrical and Computer Engineering, University of Toronto https://tspace.library.utoronto.ca/bitstream/1807/13933/1/MQ46000.pdf.*

(Continued)

*Primary Examiner* — Kandasamy Thangavelu
(74) *Attorney, Agent, or Firm* — Leydig, Voit & Mayer, Ltd.

(57) ABSTRACT

A programmed computer and method are described for generating a processor design. The method carried out by the programmed computer comprises providing an initial model for the processor, specifying a plurality of resources in terms of resource parameters and their mutual relations. Furthermore, statistics are provided indicative of the required use of the resources by a selected application. Thereafter, a reduced resource design is generated by the programmed computer by relaxing at least one resource parameter and/or limiting an amount of resources specified in the initial specification on the basis of the statistics.

13 Claims, 6 Drawing Sheets

U.S. PATENT DOCUMENTS

| | | | |
|---|---|---|---|
| 2003/0171907 A1* | 9/2003 | Gal-On et al. | 703/14 |
| 2004/0250231 A1* | 12/2004 | Killian et al. | 716/18 |
| 2005/0097531 A1* | 5/2005 | Fischer et al. | 717/140 |
| 2005/0137840 A1* | 6/2005 | Peck et al. | 703/13 |
| 2005/0235173 A1* | 10/2005 | De Oliveira Kastrup Pereira | 713/324 |
| 2006/0004996 A1* | 1/2006 | Gonion | 712/241 |
| 2006/0259878 A1* | 11/2006 | Killian et al. | 716/1 |

OTHER PUBLICATIONS

Book Readings in hardware/software co-design by Giovanni De Micheli, Rolf Ernst, Wayne Hendrix Wolf p. 436, col. 2, line 1-20 Copyright 2002 Academic press.*

International Search Report dated Feb. 10, 2009, for PCT/NL2008/050688.

Wahlen et al., "*Application Specific Compiler/Architecture Codesign: A Case Study*" Sigplan Notices ACM USA, vol. 37. No. 7, (Jul. 2002) pp. 185-193.

Potlapally et al., "*Impact of Configurability and Extensibility on IPSec Protocol Execution on Embedded Processors*" VLSI Design, 2006, Held Jointly With 5$^{th}$ International Conference on Embedded Systems and Design., 19th International Conference on Hyderabad, India Jan. 3-7, 2006, IEEE, pp. 299-304.

Leupers et al.,"Retargetable compilers and architecture exploration for embedded processors, Embedded microelectronic systems:status and trends," IEE Proceedings: Computers and Digital Techniques, IEE vol. 152, No. 2, Mar. 4, 2005, pp. 209-223.

Halambi et al. "EXPRESSION: A Language for Architecture Exploration through Compiler/Simulator Retargetability" Design, Automation and Test in Europe Conference and Exhibition 1999. Proceedings Munich, Germany Mar. 9-12, 1999, IEEE Comput. Soc, US, Mar. 9, 1999, pp. 485-490.

* cited by examiner

| Resource | sub resource | parameter | value | used/notused |
|---|---|---|---|---|
| RF1 | | nports | NR1 | UNR1 |
| | | capacity | CR1 | UCR1 |
| | | width | WR1 | UWR1 |
| | | latency | LR1 | ULR1 |
| RF2 | | nports | NR2 | UNR2 |
| | | capacity | CR2 | UCR2 |
| | | width | WR2 | UWR2 |
| | | latency | LR2 | ULR2 |
| .... | | | | |
| RFn | | nports | NR3 | UNR3 |
| | | capacity | CR3 | UCR3 |
| | | width | WR3 | UWR3 |
| | | latency | LR3 | ULR3 |
| BUS1 | | width | WB1 | UWB1 |
| | | latency | LB1 | ULB1 |
| | | bandwidth | BB1 | UBB1 |
| BUS2 | | | | |
| .... | | | | |
| BUSk | | | | |
| IS1 | FU1_add | width | FW1 | UFW1 |
| | | speed | FS1 | UFS1 |
| IS2 | FU2_mult | | | |
| | FU1 | | | |
| | FU2 | | | |
| | FU3 | | | |
| Isn | FU1 | | | |
| | FU2 | | | |

FIG. 3

| Ref. nr | Resource | parameter | value | used/notused |
|---|---|---|---|---|
| 100 | Fetch | | | |
| 101 | program counter | n-pc | NPC1 | UNPC1 |
| 102 | Instruction memory | n-addr | NIM1 | UNIM1 |
| 103 | ADD1 | n_add | NADD0 | UNADD0 |
| 104 | MUX2 | n-sel | NMX1 | UNMX1 |
| 109 | IF_ID | | | |
| 110 | Decode | | | |
| 111 | Registers | n-reg | NR4 | UNR4 |
| 112 | Sign extend | | | |
| 119 | ID_EX | | | |
| 120 | Execute | | | |
| 121 | ADD2 | n-add | NADD1 | UNADD1 |
| 122 | Shift Left | | | |
| 123 | ALU | n-add | NADD2 | UNADD2 |
| | | n-mul | NMUL1 | UNMUL1 |
| | | ... | ... | ... |
| 124 | MUX1 | n-sel | NMX2 | UNMX2 |
| 125 | ALU ctrl | | | |
| 126 | MUX4 | n-sel | NMX3 | UNMX3 |
| 129 | EX_MEM | | | |
| 130 | memory access | | | |
| 131 | AND-gate | | | |
| 132 | data memory | n-addr | NDM2 | UNDM2 |
| 139 | MEM_WB | | | |
| 140 | write-back | | | |
| 141 | MUX3 | n-sel | NMX4 | UNMX4 |

FIG. 5

METHOD AND APPARATUS FOR DESIGNING A PROCESSOR

CROSS-REFERENCE TO RELATED APPLICATION

This application claims the priority benefit of Augusteijn, et al. U.S. Provisional Patent Application Ser. No. 60/984,593, filed on Nov. 1, 2007, entitled "Method And Apparatus For Designing A Processor," the contents of which are expressly incorporated herein by reference in their entirety, including any references therein.

FIELD OF THE INVENTION

The present invention relates to an apparatus and method for generating a processor design, and more particularly a programmed computer system.

BACKGROUND OF THE INVENTION

Application specific instruction set processors (ASIPs) are processors designed for a certain application domain. The processor design comprises a plurality of resources that are functionally coupled together. Resources are understood to be all facilities used in the processor to carry out tasks, such as computation resources, e.g. low level computation resources such as multipliers and adders; high level computation resources such as filters and transform units; storage resources, such as register files and memory devices; communication resources such as ports, busses, point to point links, networks; and routing resources therein such as multiplexers. The amount, type and size of the processor resources (e.g., register files, instruction set, parallelism, interconnect) are tuned for a particular application domain of interest.

Automatic design tools such as ARM Optimode, are offered that support the designer in the development of such ASIPs. An automatic design tool is described for example in WO2004017232 of CoWare. The designer may use a design language like LISA 2.0 to describe various aspects of a processor architecture including: behavior, instruction set coding, and syntax. All components of the target system can be described in a uniform manner using syntax that is an extension to the C/C++ programming language. LISA 2.0 descriptions are non-ambiguous specifications that can be exchanged between designers of processors, software development tools, and designers of hardware/software systems. Furthermore, a hierarchical modeling style is supported to allow structuring and easy maintenance of the code. Accordingly the designer can reuse existing modules, like processing facilities (e.g., adders and multipliers), more complex processing elements, storage facilities (e.g., memories, caches and register files), and interconnect facilities (e.g., busses, networks and direct links between other facilities. Another known high-level language is nML of Target Compiler Technologies.

An ASIP is typically applied in an embedded system if general purpose processors (GPPs) or digital signal processors (DSPs) are not capable of delivering a sufficient level of performance and hard-wired blocks do not offer enough flexibility. In such an embedded system, the ASIP usually runs a single application that may even be encoded in ROM, thereby limiting the programmability to design time.

SUMMARY OF THE INVENTION

A program in ROM may not need all resources offered by the processor. Accordingly for a particular program the processor may have unused resources. Though unused, the resources still have unfavorable consequences in that they occupy silicon area, and may consume power. The unused resources may also slow down the processor. For example the time required for address decoding generally increases with the address space. Accordingly, if the processor comprises unused cache resources the address decoding time is longer than necessary. Despite the availability of automatic design tools the development of a new ASIP that does not have superfluous resources for said application would still be costly. Embodiments of the present invention describe herein below address these disadvantages.

Accordingly, a method for generating a processor design is provided comprising the steps of:

providing an initial model for the processor, specifying a plurality of resources in terms of resource parameters, providing statistics indicative for the required use of the resources by a selected application, and relaxing at least one resource parameter and/or limiting an amount of resources specified in the initial specification on the basis of the statistics to render a processor design.

The above-summarized set of steps for generating a processor design makes a resulting processor more efficient. Removing unused resources results in a reduction of silicon area. The exclusion of unneeded processor components also results in a reduced power usage. In embodiments the resulting processor speed may be increased, for example as a result of a reduced decoding time. The resulting processor is less flexible, and may even be no longer programmable, for example if its application programs are stored in a ROM. However, this is not a disadvantage as it need only carry out the application for which the statistics were provided.

It is noted that WO2004/017232 mentions that evaluation of chip size, clock speed and power consumption from a simulator may be used to modify a target architecture design. However the aforementioned publication does not disclose determining usage of components and using this information to automatically adapt the architecture by removing unused resources.

The method for generating a processor design described herein is particularly suitable for generating VLIW processor designs, because the issue slots therein operate relatively independently from each other. Accordingly for these types of processors it can be determined relatively easy which issue slots are used and which are not. Those issue slots not used by software of the application can easily be identified, as they will only have NOP instructions in compiled code. Alternatively, instead of removing resources at the level of issue slots, more resources are potentially removed at a more fine-grained level (e.g., removing certain functional units and/or the capability for execution of certain operations).

Two types of instruction encoding for programmable processors are considered: (1) data stationary encoding and (2) time stationary encoding. In data stationary encoding, which is the most common type, all information related to all processing aspects (fetching, decoding, calculating, writing) of a single data item are encoded in one and the same instruction irrespective of the actual moment in time when the processing is carried out. Hence, data stationary processors must themselves delay instruction information in such a way that all internal processor resources needed to carry out those processing aspects receive the proper control information at the proper moment in time. The pipeline of the processor is not directly visible in the program.

This is different in time stationary processors. For time stationary processors, instructions are encoded such that they contain all information that is necessary at a given moment in time for the processor to perform its actions. In the case of a pipelined processor this implies that the pipeline is visible in the program applied to the processor.

Both data stationary and time stationary types of instruction encoding for programmable processors have their advantages and disadvantages. Data stationary encoding usually enables a smaller code size, at the cost of additional hardware required to delay the control information encoded in instructions. Time stationary encoding can be used to save the overhead of delaying hardware at the expense of larger code size. Therefore, it is mainly used in application (domain) specific processors that run relatively small programs. The fact that no delay hardware is required makes time stationary encoding particularly suitable for highly parallel VLIW cores that would otherwise require a large amount of delay hardware.

In time stationary encoding, information related to a single operation is typically spread across several instructions issued in different cycles, which means that NOP information corresponding to a single operation is spread across multiple instructions.

The described method for generating a processor design is further facilitated if the processor is a time-stationary processor, since in time stationary encoding the instructions directly steer resources, such as functional units, register files, and bus multiplexers. Nevertheless the method is also applicable to data-stationary processors provided that a processor model is available to determine what resources are steered by the instructions.

The provided method is further facilitated if the processor is a micro-coded processor. The micro-code specifies in detail which resources are used and which are not. Nevertheless the method is also applicable if the processor is controlled by a higher level instruction code, provided that a model is available for how the processor decodes the higher level instruction code into the micro-code that control its resources.

The provided method is, by way of example, implemented in a computer-readable medium including computer-readable instructions contained (and executed upon) a processor design computer system for rendering a processor design from input design and statistical information described herein.

BRIEF DESCRIPTION OF THE DRAWINGS

These and other aspects are described in more detail with reference to the drawings, wherein:

FIG. 3 schematically shows a part of a representation of a processor architecture to which the method is applied.

DETAILED DESCRIPTION OF THE DRAWINGS

In the following detailed description numerous specific details are set forth in order to provide a thorough understanding of the present invention. However, it will be understood by one skilled in the art that the present invention may be practiced without these specific details. In other instances, well known methods, procedures, and components have not been described in detail so as not to obscure aspects of the present invention.

By way of example, an embodiment of a method according to the invention is described with reference to a processor schematically depicted in FIG. 1. The processor shown therein stores its data in register files (RF1, ..., RFn) through a register file write port (wp). A register file (RF) has a certain capacity, which is the number of registers in the register file. The data in a register file is read through a register file read port (rp) and fed via an issue slot input port (is-ip) to a function unit input port (fu-ip). The functional unit performs an operation on the data that produces an output value on the function unit output port (fu-op), which is transferred to an issue slot output port (is-op). From there, the value is passed to one or more busses via a bus input port (bus-ip). Then, the value is passed from a bus output port (bus-op) to one or more register file write ports (wp).

Figure 1:
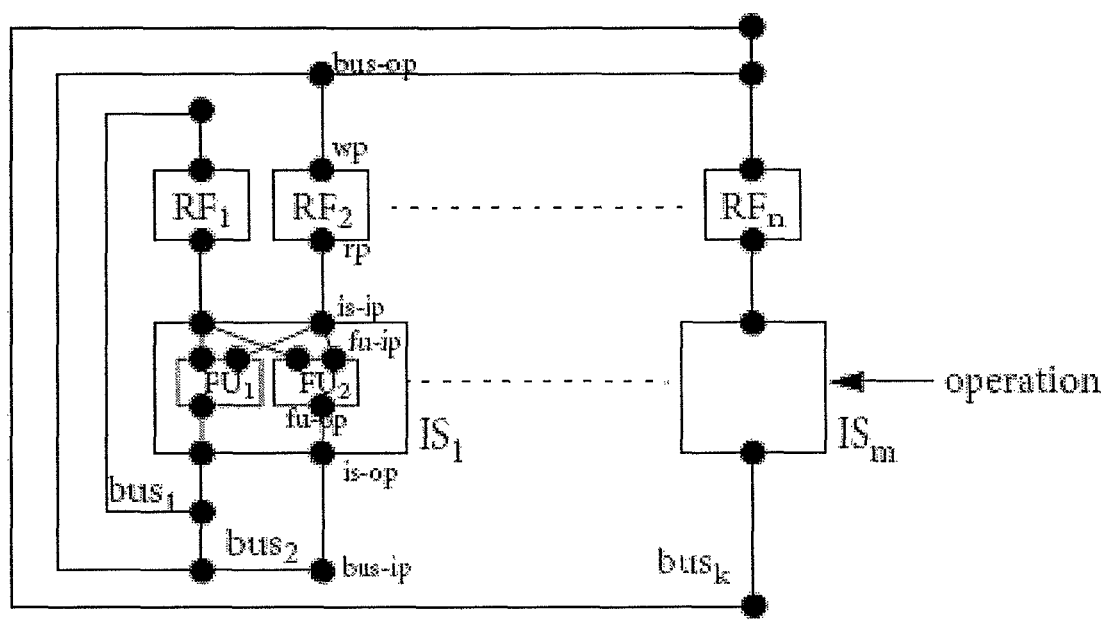
FIG. 1 shows an example of a processor architecture.

The processor shown in FIG. 1 is time stationary encoded. For time stationary processors, instructions are encoded such that they contain all information that is necessary at a given moment in time for the processor to perform its actions. In the case of a pipelined processor this implies that the pipeline is visible in the program applied to the processor.

The processor resources mentioned above (e.g., register files, functional units, etc.) are optionally used by a given set of programs. Analysis of a program reveals whether processor resources are used, and such analysis produces a list of processor resources used by the program. This analysis is particularly straight-forward for processors with time-stationary encoding. This list of resources is used to remove all unused resources from a processor. This potentially reduces the register file capacity of individual register files, limits the operation set, and removes certain ports and busses. It potentially removes complete register files, functional units or issue slots.

The resulting processor, as a result of the above-described removal of resources, will likely be much less programmable than the original (full resource) one, but the reduced resource processor will at least support the programs used to generate a processor design from which the resulting processor was constructed. Also, the reduced resource processor will be more efficient in terms of area, speed, power and code size, than the originally contemplated full resources processor.

Furthermore, to exploit the improved code size, the programs are recompiled for the reduced resource processor generated from the above-summarized design generation steps.

Alternatively the method according to the invention is applied to a processor with data stationary encoding. In data stationary encoding, which is the most common type, all information related to the processing of a single data item is encoded in one and the same instruction. For example, to encode the addition of two values in data stationary form an opcode 'add', argument addresses 'a' and 'b', and result address 'c' are encoded in the same instruction (i.e. c=add(a, b)). This specification would look the same irrespective of the possible internal pipelining of the processor. Hence, data stationary processors themselves delay instruction information in such a way that all internal processor resources receive the proper control information at the proper moment in time. The pipeline of the processor is not directly visible in the program. Both types of encoding have their advantages and disadvantages. Data stationary encoding usually enables a smaller code size, at a cost of additional hardware required to delay the control information encoded in instructions.

Time stationary encoding can be used to save the overhead of delaying hardware at the expense of larger code size. Therefore, it is mainly used in application (domain) specific processors that run relatively small programs. The fact that no delay hardware is required makes time stationary encoding particularly suitable for highly parallel VLIW cores that would otherwise require a large amount of delay hardware.

In time stationary encoding, information related to a single operation is typically spread across several instructions issued in different cycles, which means that NOP information corresponding to a single operation is spread across multiple instructions. Furthermore, instructions for time stationary processors often do not encode operations as atomic entities. Instead, they encode control information to directly steer resources, such as functional units, register files, and bus multiplexers. Decoupling 'abstract' operation information from actual resource steering, allows techniques such as multicasting where the result of a single operation is optionally written to multiple register files in a single processor cycle. As a result of the decoupling, the same field (e.g. a write register index field) in a time stationary instruction can carry information corresponding to operations executed on different issue slots in different clock cycles.

Figure 2:
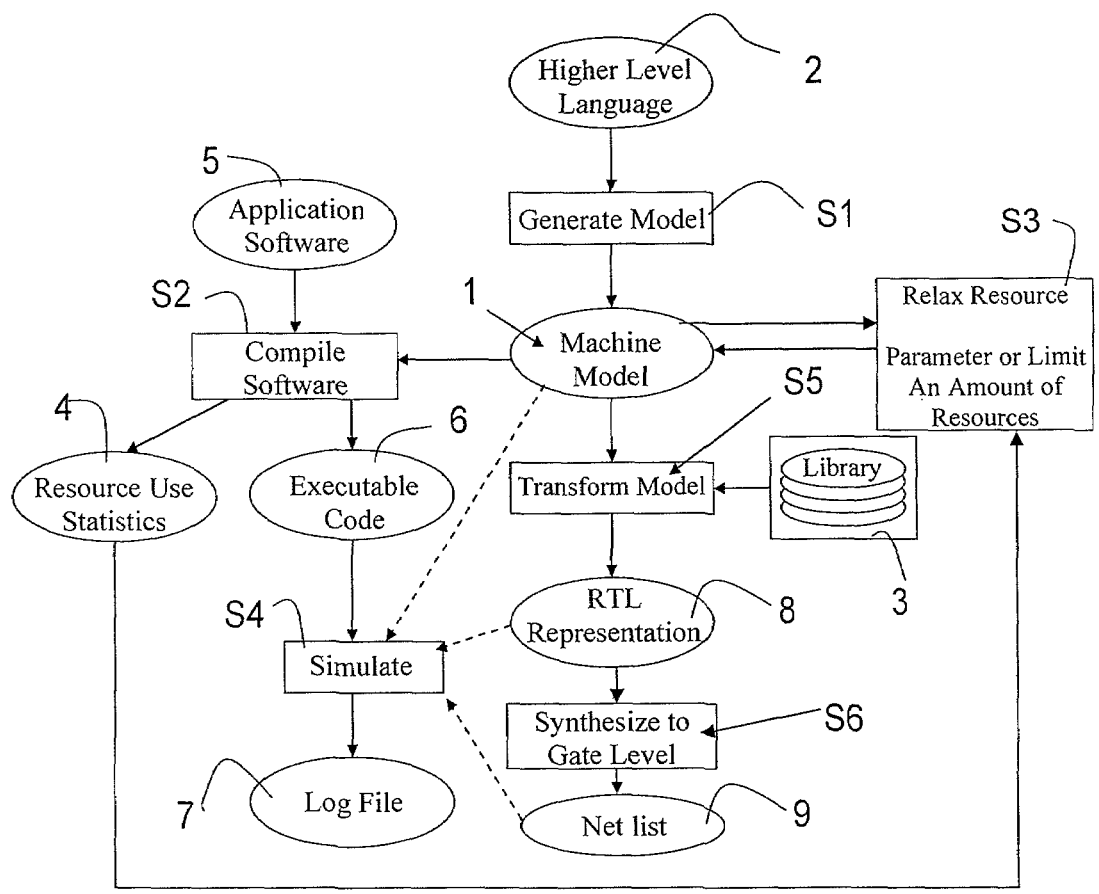
FIG. 2 schematically shows a method according to the invention.

FIG. 2 summarizes a set of steps, carried out in accordance with computer-executable instructions executed on a workstation, for an embodiment of the method according to the invention for generating a processor design for construction and execution for a particular application or applications.

In a first step an initial model 1 for the processor is provided, wherein resources like processing facilities (e.g., adders, multipliers and more complex processing elements), storage facilities (e.g., memories, caches and register files), and interconnect facilities (e.g., buses, networks and direct links between other facilities) are specified. The model is, for example, a machine readable representation of a higher level language 2 such as LISA or nML. The machine readable representation, e.g. in the form of an abstract syntax tree representation, is usually generated automatically during step S1 by a dedicated compiler from a specification in the high-level language. US 2005-0246680 A1 describes the generation of such an abstract syntax tree representation in more detail.

By way of example, FIG. 3 shows a table with the resources (e.g., register files RF1, ... RFn, buses BUS 1, ..., BUSk and issue slots IS1, ..., Ism) present in the processor of FIG. 1. As specified in the table, some resources, here the issue slots, have sub-resources in the form of functional units FU1, FU2, .... In the illustrative embodiment shown in FIGS. 1 and 3, the first issue slot has an adder as a first functional unit and a multiplier as a second functional unit. Each of the resources is parameterized by one or more parameters. For example the register files are parameterized by their number of ports, capacity, width and latency, and a value is specified for each parameter.

Preferably the consistency of the processor is checked from the processor model. The resources used in the model may be generated from scratch, but are preferably available in a library 3 as generic building blocks. Such a building block describes the resource in a generic way, which means that, for example, for a register file the capacity, width and latency are still left open (unspecified). Such parameters of the building blocks are filled in by the actual values that are extracted from the machine model 1. The complete process leads to a model of the full machine in terms of hand-written, parameterized, building blocks.

At step S2, statistics 4 are provided that are indicative of the required use of the resources by a selected application. Preferably the statistics 4 are provided by compilation of software 5 forming part of the application to be used. A compiler can provide such information in step S2 as it needs to schedule the resources in the executable it has to generate. The compiler determines which resources in the initial processor model are scheduled and to what extent, and which resources are not scheduled. The compiler is, for example, generated automatically from the initial processor model 1 or configured from a template using the initial processor model 1, but may alternatively be hand-written. The compiler may in addition provide executable code 6. CoWare processor designer provides facilities for automatic compiler generation. Automatic compiler generation is also described in "A methodology and tool suite for C compiler generation from ADL processor models by" Hohenauer, M.; Scharwaechter, H.; Karuri, K.; Wahlen, O.; Kogel, T.; Leupers, R.; Ascheid, G.; Meyr, H.; Braun, G.; van Someren, H. in Design, Automation and Test in Europe Conference and Exhibition, 2004. Proceedings Volume 2, Issue, 16-20 Feb. 2004 Page(s): 1276-1281 Vol. 2.

Accordingly, after step S2 is performed by computer-executable instructions of a compiler the table as shown in FIG. 3 is completed with information indicating to what extent the resources are actually used by the intended application. For example the compiler program running on a computer system determines in step S2 that the application uses only a capacity UCR1. Instead of using a compiler for determining statistics indicative for required use, the statistics are, alternatively, obtained by a dedicated program that provides the statistics, but does not generate an executable.

Step S3 comprises relaxing a resource parameter and/or limiting an amount of resources specified in the initial specification on the basis of the statistics.

If the statistics indicate that resources are not used, then the unused resources are removed from the machine model during step S3. If the statistics indicate that resources are only used to a certain extent, for example the used capacity UCR1 is less than the specified width UR1, then the capacity of that resource is reduced, preferably to the used capacity UCR1. If the statistics point out that a bus only needs to have a maximum latency of ULB1, longer than the specified (shorter) latency LB1, then the requirement for the latency is relaxed to a value greater than LB1, preferably ULB1.

Execution of the executable code 6, by way of example, is simulated by a programmed computer system in accordance with executable instructions on a computer-readable medium at step S4. A log-file 7 is, for example, provided as a result. Execution is, by way of example, simulated by the programmed computer on the basis of the abstract processor model 1, on the basis of an RTL representation 8, or using a netlist 9 as indicated by dashed arrows to step S4.

The resulting machine model 1 is transformed at step S5 into an RTL format 8 e.g. VHDL or Verilog, or the RTL representation 8 is generated from the machine model and additional information. Subsequently the RTL representation 8 is synthesized to the gate level netlist 9 representation by conventional synthesis tools at step S6. Such tools are, for example, provided by Synopsys and Cadence.

Figure 4:
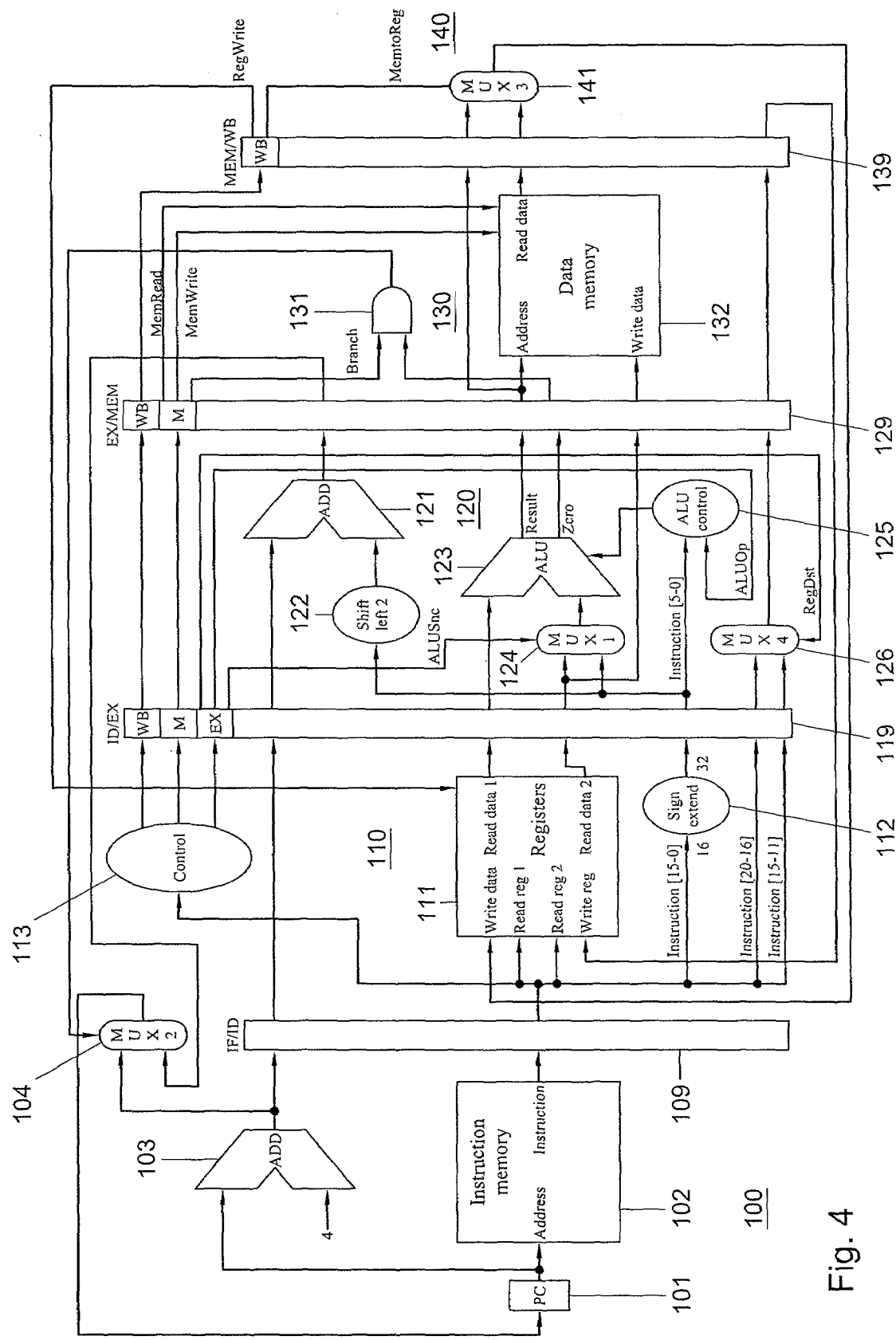
FIG. 4 shows an example of an alternative processor architecture, FIG. 5 schematically shows a part of a representation of said alternative processor architecture to which the method is applied.

An alternative processor model is shown in FIG. 4. In this case the processor is a data-stationary RISC processor as designed by MIPS. The processor has the form of conventional five-stage pipeline with an instruction fetch stage 100, an instruction decode/register fetch stage 110, an execute/address calculation stage 120, a memory access stage 130, and a write back stage 140. Between each two subsequent stages a register resp. 109, 119, 129, 139 is present to allow the pipelined operation of the respective stages.

The table of FIG. 5 summarizes the resources in the initial processor model (FIG. 4). The instruction fetch stage 100 comprises a program counter 101, an instruction memory 102 addressed by the program counter 101, and an adder 103 for stepwise incrementing the program counter. The instruction fetch stage 100 is coupled via pipeline registers 109 to the instruction decode/register fetch stage 110. The instruction decode/register fetch stage 110 comprises a register file 111, a sign extend unit 112, a control unit 113 and pipeline registers to couple the instruction decode/register fetch stage 110 with the execute/address calculation stage 120. The execute/address calculation stage 120 comprises an adder 121, a shift left unit 122, an ALU 123, a controller for the ALU and multiplexers 124 and 126. The execute/address calculation stage is coupled via pipeline registers 129 to the memory access stage 130. The memory access stage 130 is provided with a data memory 132 and a gate 131. The gate 131 controls the multiplexer 104, to select the stepwise increased program counter value, or a jump target value. The memory access stage 130 is coupled with pipeline registers 139 to the write back stage 140. The latter comprises a multiplexer 141.

Analogous to the initial processor design shown in FIG. 1 the resources of the processor model depicted in FIG. 4 may be characterized by one or more parameters. By way of example, parameters for some of those resources are shown in FIG. 5. For example the program counter 101 has a parameter n-pc indicative for the counting range of the counter. The counter 101 may have an initial (default) range NPC1. The memories 102, 132 used in the design may be parameterized by an address range. For example the instruction memory 102 has an address range n-addr, with an initial value of NIM1, and the data memory 132 has an address range n-addr with an initial value of NDM1.

Other resources, utilized by a programmed computer including computer-executable instructions for generating a processor design, may have predetermined dimensions, but may be associated with a parameter that indicates whether the resource is present in the design. For example the adder 121 is associated with a parameter 'n-add'. A value NADD1=1 (default) indicates that the adder is present in the design. NADD1=0 indicates that the adder is absent. Still other resources may have a plurality of parameters indicative for the presence of functionalities thereof. For example the ALU 123 may have a first parameter 'n-add' indicating whether it has addition capabilities and a second parameter n-mul indicating whether it has multiplication capabilities. The default value NADD2=1 for n-add indicates that the addition capability is present and the default value NMUL1=1 for n-mul indicates that the multiplication capability is present.

Other resources in the design may be mandatory, such as the first adder 103 that increments the program counter 101. The width of the adder 103 may be scaled automatically with the size of the program counter 101. Alternatively the adder may have a fixed width.

Analogous to the processor design generator described with reference to FIG. 1, the method described with reference to FIG. 2 is applied. Step S2 of the method provides the statistics 4 indicative for use of the various resources described within the initial processor design. The provided statistics are for example those presented in the column 'used/not used' of the table in FIG. 5. Therein, for example, the value UNPC1 indicates the actually used counting range of counter 101. The memories 102, 132 used in the design may be parameterized by an address range. The values UNIM1 and UNDM2 indicate the address ranges used respectively for the instruction memory 102 and the data memory 132. The value UNADD2 indicates whether the adder 121 is used by the application. UNADD2=1, 0 respectively indicate that the adder respectively is used, not used. The value UNADD3 indicates whether the addition capabilities of the ALU 123 are used by the application (1=yes, 0=no) and the value UNMUL1 indicates whether its multiplication capabilities are used (1=yes, 0=no).

Analogous to the design of FIG. 1 the statistical information 4 is used in step S3 to relax the resource parameters and/or to limit an amount of resources specified in the initial specification 1 on the basis of the statistics. The specification 1 of the processor amended in this way is converted to a RTL specification in step S5 and synthesized to a netlist in step S6.

Figure 6:
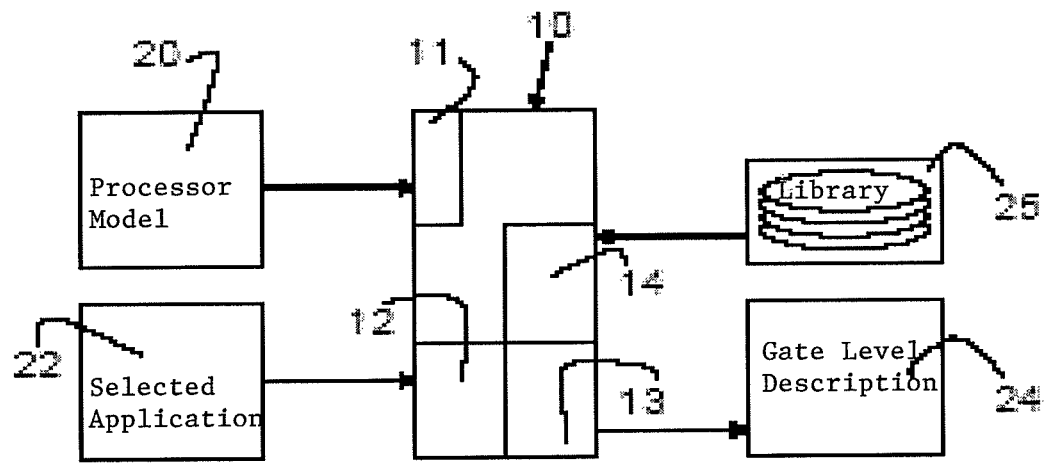
FIG. 6 shows a first embodiment of a design system for generating a processor design.

FIG. 6 shows an exemplary programmed computer system containing computer-executable instructions for generating a processor design. A design system 10 comprises a first programmed facility 11 for receiving an initial model 20 for the processor under design, the initial model specifying a plurality of resources in terms of resource parameters and their mutual relations. The programmed facility 11 is for example a data link coupled to a data storage unit that stores the initial model. The design system further comprises a second programmed facility 12 for providing statistics indicative for required use of the resources by a selected computer program application 22. The second programmed facility 12 is for example a programmed processor that executes step S2 described with reference to FIG. 2. The design system further comprises a third programmed facility 13 for relaxing at least one resource parameter and/or limiting an amount of resources specified in the initial specification on the basis of the statistics. The third facility 13 is, for example, a processor that carries out the process of step S3 described with reference to FIG. 2. A fourth programmed facility 14 is further provided for generating an RTL representation from the final specification obtained by facility 13 therewith using a library of modules and for synthesizing a gate level description 24. The facility 14 is, for example, a processor carrying out the processes of step S5 and step S6. Facilities 12, 13 and 14 are alternatively implemented by a single programmed processor. The one or more programmed processors for implementing the facilities are, for example, in the form of dedicated hardware, but may otherwise be in the form of a general purpose processor that executes suitable software.

Figure 7:
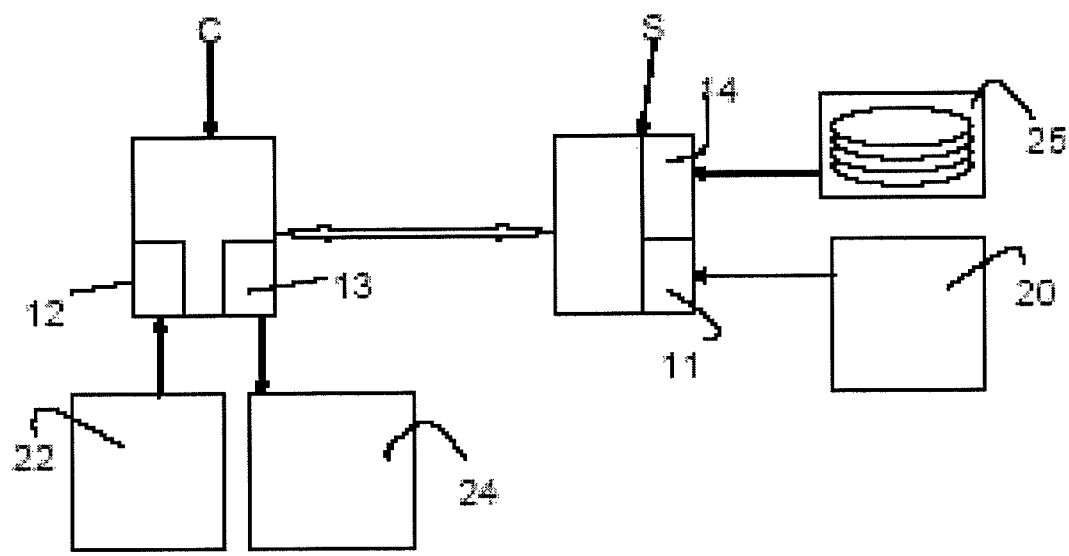
FIG. 7 shows a second embodiment of a design system for generating a processor design.

Not all elements of the design system need to be present at the same location. In an embodiment elements may be coupled via a data connection, e.g. the internet. The design system may, for example, comprise a server and a client station as shown in an alternative embodiment in FIG. 7. Therein the client station has the facility 12 for providing statistics indicative for the required use of the resources by a selected application 22 and the facility 13 for relaxing at least one resource parameter and/or limiting an amount of resources specified in the initial specification on the basis of the statistics. The server station may have the facility 11 for receiving an initial model 20 for the processor and a facility 14 for generating an RTL representation from the final specification obtained by facility 13 therewith using a library of modules 25. The server station preferably stores the initial processor model 20 and the library of modules 25, while the client station stores the information about the application 22 and the final result, the RTL representation and/or a gate level description 24 synthesized from that representation.

In the claims the word "comprising" does not exclude other elements or steps, and the indefinite article "a" or "an" does not exclude a plurality. A single component or other unit may fulfill the functions of several items recited in the claims. The mere fact that certain measures are recited in mutually different claims does not indicate that a combination of these measures cannot be used to advantage. Any reference signs in the claims should not be construed as limiting the scope.

What is claimed is:

1. A method for generating, on a programmed computer system comprising a server station with a first programmed facility and a client station with a second, a third and a fourth programmed facility, a processor design, the method comprising the steps of:

providing an initial model for the processor to the first programmed facility, the initial model specifying a plurality of resources in terms of resource parameters and their mutual relations, providing a selected application to the second programmed facility, compiling, by the third programmed facility including a compiler, software used by the selected application, the compiler, included in the third programmed facility, providing statistics indicative of resources required for use by the selected application, and relaxing at least one resource parameter and/or limiting an amount of resources specified in the initial model specification by the fourth programmed facility on the basis of the statistics.

2. The method according to claim 1, wherein the resources comprise at least one of processing resources, storage resources and communication resources.

3. The method according to claim 1, wherein the processor is a VLIW processor.

4. The method according to claim 1, wherein the processor is a time-stationary processor.

5. The method according to claim 1, wherein the processor is a data-stationary processor.

6. The method according to claim 1, wherein the processor is a microcoded processor.

7. A design computer system including a computer readable medium including computer executable instructions for generating a processor design, the computer system comprising a server station and a client station:

the server station having a first programmed facility for receiving an initial model for the processor, the initial model specifying a plurality of resources in terms of resource parameters and their mutual relations, the client station having a second programmed facility for receiving a selected application, the client station having a third programmed facility for compiling software used by the selected application with a compiler, the design computer system further comprising said third programmed facility for providing statistics indicative of resources required for use by the selected application with said compiler, the client station having a fourth programmed facility for relaxing at least one resource parameter and/or limiting an amount of resources specified in the initial model specification on the basis of the statistics.

8. A non-transitory computer-readable medium including computer-executable instructions for causing a computer system comprising a server station and a client station to generate a processor design by performing the steps of:

causing the server station to provide an initial model for the processor, specifying a plurality of resources in terms of resource parameters and their mutual relations, causing the server station to provide a selected application, causing the client station to compile the selected application with a compiler, said compiler providing statistics indicative of resources required for use by the selected application, and causing the client station to relax at least one resource parameter and/or limiting an amount of resources specified in the initial model specification on the basis of the statistics.

9. The non-transitory computer-readable medium according to claim 8, wherein the resources comprise at least one of processing resources, storage resources and communication resources.

10. The non-transitory computer-readable medium according to claim 8, wherein the processor is a VLIW processor.

11. The non-transitory computer-readable medium according to claim 8, wherein the processor is a time-stationary processor.

12. The non-transitory computer-readable medium according to claim 8, wherein the processor is a data-stationary processor.

13. The non-transitory computer-readable medium according to claim 8, wherein the processor is a microcoded processor.

* * * * *